United States Patent
Seyyedy et al.

(10) Patent No.: US 6,252,293 B1
(45) Date of Patent: *Jun. 26, 2001

(54) LASER ANTIFUSE USING GATE CAPACITOR

(75) Inventors: Mirmajid Seyyedy; Manny K. F. Ma, both of Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/109,605

(22) Filed: Jul. 2, 1998

Related U.S. Application Data

(63) Continuation of application No. 08/582,652, filed on Jan. 4, 1996, now Pat. No. 5,811,869.

(51) Int. Cl.[7] ............................................. H01L 29/00
(52) U.S. Cl. ............................................. 257/530; 257/209
(58) Field of Search ........................... 257/530, 209, 257/410

(56) References Cited

U.S. PATENT DOCUMENTS

| | | | |
|---|---|---|---|
| 4,233,671 | * 11/1980 | Gerzberg et al. | 257/530 |
| 4,387,503 | * 6/1983 | Aswell et al. | 257/530 |
| 4,488,262 | 12/1984 | Basire et al. | 257/530 |
| 4,569,120 | * 2/1986 | Stacy et al. | 257/530 |
| 4,748,490 | 5/1988 | Hollingsworth | 357/51 |
| 4,751,197 | * 6/1988 | Wills | 257/530 |
| 5,019,532 | 5/1991 | Kaya | 437/186 |
| 5,057,451 | 10/1991 | McCollum | 437/69 |
| 5,087,589 | * 2/1992 | Chapman et al. | 257/530 |
| 5,109,532 | 4/1992 | Petrovic et al. | 455/63 |
| 5,110,754 | * 5/1992 | Lowrey et al. | 257/530 |
| 5,134,457 | 7/1992 | Hamdy et al. | 357/51 |
| 5,148,391 | 9/1992 | Zagar | 365/96 |
| 5,166,901 | 11/1992 | Shaw et al. | 365/105 |
| 5,200,652 | * 4/1993 | Lee | 257/530 |
| 5,208,177 | * 5/1993 | Lee | 257/530 |
| 5,223,206 | 6/1993 | Lee et al. | 257/50 |
| 5,231,050 | * 7/1993 | Boudou et al. | 257/530 |
| 5,233,206 | 8/1993 | Lee. et al. | 257/50 |
| 5,241,496 | * 8/1993 | Lowrey et al. | 257/530 |
| 5,250,459 | * 10/1993 | Lee | 257/530 |
| 5,257,222 | * 10/1993 | Lee | 257/530 |
| 5,264,725 | 11/1993 | Mullarkey et al. | 257/665 |
| 5,272,097 | 12/1993 | Shiota | 437/34 |
| 5,272,666 | 12/1993 | Tsang et al. | 365/96 |
| 5,276,653 | 1/1994 | McKenny | 365/225.7 |
| 5,281,553 | * 1/1994 | Boudou et al. | 257/530 |
| 5,282,158 | * 1/1994 | Lee | 257/530 |

(List continued on next page.)

FOREIGN PATENT DOCUMENTS

| | | | |
|---|---|---|---|
| 59-105354A | 6/1984 | (JP) | H01L/27/08 |
| 61-046045 | 3/1986 | (JP) . | |

OTHER PUBLICATIONS

"Copy of PCT Search Report dated May 21, 1997, for International Application No. PCT/US 97/00167", 7 pages.

Primary Examiner—Sara Crane
(74) Attorney, Agent, or Firm—Schwegman, Lundberg, Woessner & Kluth, P.A.

(57) ABSTRACT

An integrated circuit laser antifuse is described which has two physical states. In the first physical state the laser antifuse has to conductive plates electrically separated by a layer of dielectric material. In the second physical state the two conductive plates are electrically connected through the dielectric in response to an external radiation source, such as a laser.

35 Claims, 3 Drawing Sheets

U.S. PATENT DOCUMENTS

| | | | |
|---|---|---|---|
| 5,299,152 | 3/1994 | Ishihara et al. | 365/96 |
| 5,301,159 * | 4/1994 | Lee | 257/530 |
| 5,303,199 * | 4/1994 | Ishihara et al. | 257/530 |
| 5,315,177 * | 5/1994 | Zagar et al. | 307/465 |
| 5,324,681 * | 6/1994 | Lowrey et al. | 257/530 |
| 5,331,196 | 7/1994 | Lowrey et al. | 257/529 |
| 5,412,244 * | 5/1995 | Hamdy et al. | 257/530 |
| 5,444,290 * | 8/1995 | Paz De Araujo et al. | 257/530 |
| 5,463,244 * | 10/1995 | DeAraujo et al. | 257/530 |
| 5,506,518 | 4/1996 | Chiang | 326/41 |
| 5,508,220 | 4/1996 | Eltoukhy | 437/60 |
| 5,552,743 | 9/1996 | Manning | 327/567 |
| 5,742,555 | 4/1998 | Marr et al. | 365/225.7 |
| 5,789,796 | 8/1998 | Kang et al. | 257/530 |
| 5,811,869 * | 9/1998 | Seyyedy et al. | 257/530 |
| 5,834,813 | 11/1998 | Ma et al. | 257/368 |
| 5,973,380 | 10/1999 | Cutter et al. | 257/530 |
| 5,973,725 | 10/1999 | Lee | 348/21 |
| 6,069,064 | 5/2000 | Cutter et al. | 438/600 |

* cited by examiner

LASER ANTIFUSE USING GATE CAPACITOR

This application is a continuation of U.S. Ser. No. 08/582,652 filed Jan. 4, 1996, U.S. Pat. No. 5,811,869.

TECHNICAL FIELD OF THE INVENTION

The present invention relates generally to integrated circuits and in particular the present invention relates to a laser antifuse fabricated in an integrated circuit.

BACKGROUND OF THE INVENTION

Integrated circuits commonly use programmable elements such as fusible links to allow custom programming of the integrated circuits after fabrication. While fusible links can be used for a variety of applications, they can be particularly useful in replacing defective circuits with redundant circuits. For example, integrated circuit memories are often fabricated with redundant memory cells. These memory cells can be selectively enabled after fabrication to replace defective memory cells which are detected during test operations.

One type of fusible link which could be used is a standard polysilicon fuse. The fuse comprises a polysilicon conductor approximately $1\mu$ thick which is fabricated on the integrated circuit such that in its normal state there is a complete electrical path through the fuse. To program the fuse, a high power laser is used to open the electrical path by evaporating a portion of the polysilicon. While effective, the use of polysilicon fuses is limited by physical size requirements. That is, the fuses must be spaced so that neighboring fuses are not damaged when a fuse is opened using a laser. As integrated circuits continue to be fabricated with high density circuitry, the need for more, fusible links also increases. The physical spacing requirements of laser fuses, therefore, prohibits their effective use in these high density circuits.

Another type of fusible link which has been used in integrated circuits is an antifuse. The antifuse is electrically opposite of the fuse in that the antifuse is a normally open circuit. To program the antifuse, its connections are shorted together to form an electrical path through the antifuse. One type of antifuse which is commonly used in integrated circuits is an oxide-nitride-oxide (ONO) antifuse. A typical ONO antifuse has a layer of nitride sandwiched between two layers of oxide, where the bottom layer of oxide is in contact with polysilicon and the top layer of oxide is also in contact with polysilicon. The ONO sandwich is a dielectric such that the un-programmed antifuse functions as a capacitor. To program the ONO antifuse, a large potential is applied to the top polysilicon such that the dielectric is ruptured and the two polysilicon layers are shorted together. Although ONO antifuses are currently used in integrated circuits, their continued use in high density integrated circuits is questionable. This is primarily due to the material used to fabricate the high density integrated circuits. The nitride needed for the ONO sandwich will not be available in standard fabrication and will require extra processing steps. Any extra step in the fabrication of integrated circuits is both time consuming and expensive.

For the reasons stated above, and for other reasons stated below which will become apparent to those skilled in the art upon reading and understanding the present specification, there is a need in the art for a reliable, compact antifuse which can be fabricated in high density integrated circuits without requiring additional steps.

SUMMARY OF THE INVENTION

The above mentioned problems with integrated circuit laser antifuses and other problems are addressed by the present invention and which will be understood by reading and studying the following specification. A laser antifuse is described which can be fabricated on a high density integrated circuit without the need for additional process steps.

In particular, the present invention describes a laser antifuse fabricated in an integrated circuit. The laser antifuse has first and second physical states, and comprises a first conductive plate, a second conductive plate, and a layer of dielectric material located between the first conductive plate and the second conductive plate. The first conductive plate and the second conductive plate are electrically isolated by the layer of dielectric material in the first physical state. The first conductive plate and the second conductive plate are electrically connected through the layer of dielectric material in the second physical state in response to a focused external radiation source.

In one embodiment, the first conductive plate comprises a layer of polysilicon fabricated on the layer of dielectric material. In another embodiment, the second conductive plate comprises an N-well fabricated in a P-substrate of the integrated circuit. The focused external radiation source can comprise a laser.

In another embodiment, a laser antifuse is described which is fabricated in an integrated memory circuit, and has two physical states. The laser antifuse comprises a first conductive plate, the first conductive plate being a layer of polysilicon, a second conductive plate, the second conductive plate being a well fabricated in a substrate of the integrated memory circuit, and a layer of dielectric material located between the first conductive plate and the second conductive plate. The first conductive plate and the second conductive plate are electrically isolated by the layer of dielectric material in the first physical state, and the first conductive plate and the second conductive plate are electrically connected through the layer of dielectric material in the second physical state in response to a focused external radiation source.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

Figure 1:
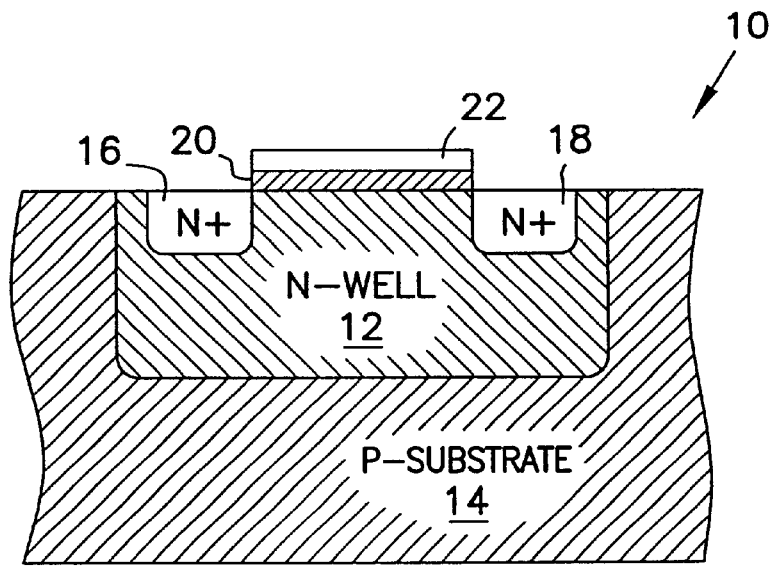
FIG. 1 is a cross-section of a laser antifuse of the present invention.
Figure 2:
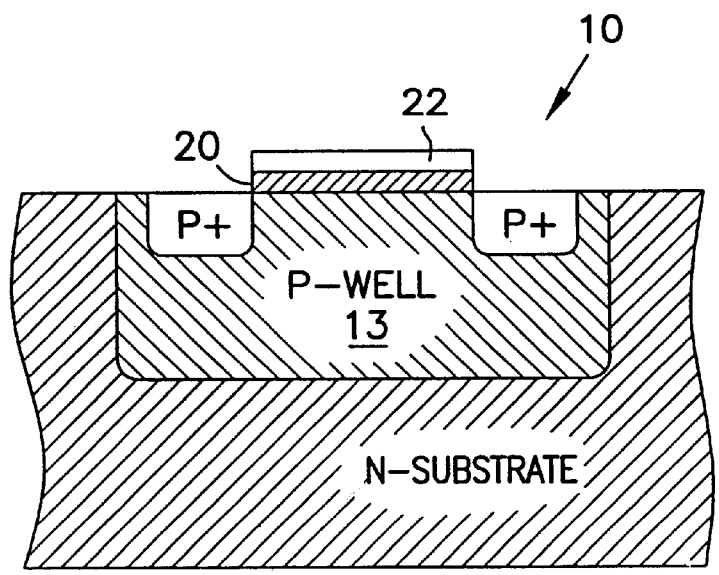
FIG. 2 is a cross-section of an alternate embodiment of a laser antifuse of the present invention.

Referring to FIG. 1, one embodiment of a laser antifuse 10 is described wherein the laser antifuse is fabricated as a capacitor using standard transistor fabrication techniques. The preferred capacitor is physically large and referred to as a "fat" capacitor. The fat capacitor is fabricated in an N-well 12 which has been formed in a P-substrate 14 of the integrated circuit. The capacitor has two N+ contact regions 16 and 18 formed into the N-well. The N+ contact regions, as known to those skilled in the art, are produced during transistor source and drain fabrication steps. A layer of dielectric 20, preferably oxide, is fabricated on the N-well and a polysilicon gate 22 is fabricated on the oxide layer. The oxide layer is preferably about 100 Å thick. The laser antifuse 10, therefore, is electrically connected as a capacitor where the gate 22 is the first capacitor plate and the N-well 12 is the second capacitor plate. Circuit connections can be made to the second plate through either N+ region 16 or 18. It will be appreciated that the laser antifuse can be fabricated using a P-well 13, as illustrated in FIG. 2. Further, the oxide preferably used in dielectric layer 20 can be replaced with a suitable dielectric material. For example, Barium Strontium Titanium (BaSrTi(03))can be used in place of the oxide layer. This material has dielectric properties at low voltage levels, and exhibits conductive properties at higher voltage levels. It will be appreciated that BaSrTi(03) can not be used in place of the ONO sandwich dielectric described above. That is, BaSrTi(03) can not be readily ruptured merely using higher voltage levels.

To program laser antifuse 10, a laser beam is directed through gate 22 such that the dielectric is ruptured and the gate and N-well 12 are shorted together. The energy level of the laser, therefore, needs to be sufficient to merely punch through about 100 Å of oxide. This energy level is substantially lower than the energy level needed to program the polysilicon fuse described above. Any type of laser or focused radiation source used on integrated circuits can be used to program laser antifuse 10. A NDYAG laser having a 1064 nanometer wavelength and 0.5 joule of energy was used with success during experimentation to produce holes having areas of 1 to 2 $\mu$meter$^2$ in gate 22. These holes provided a reliable contact between the gate 22 and N-well 12.

Figure 3:
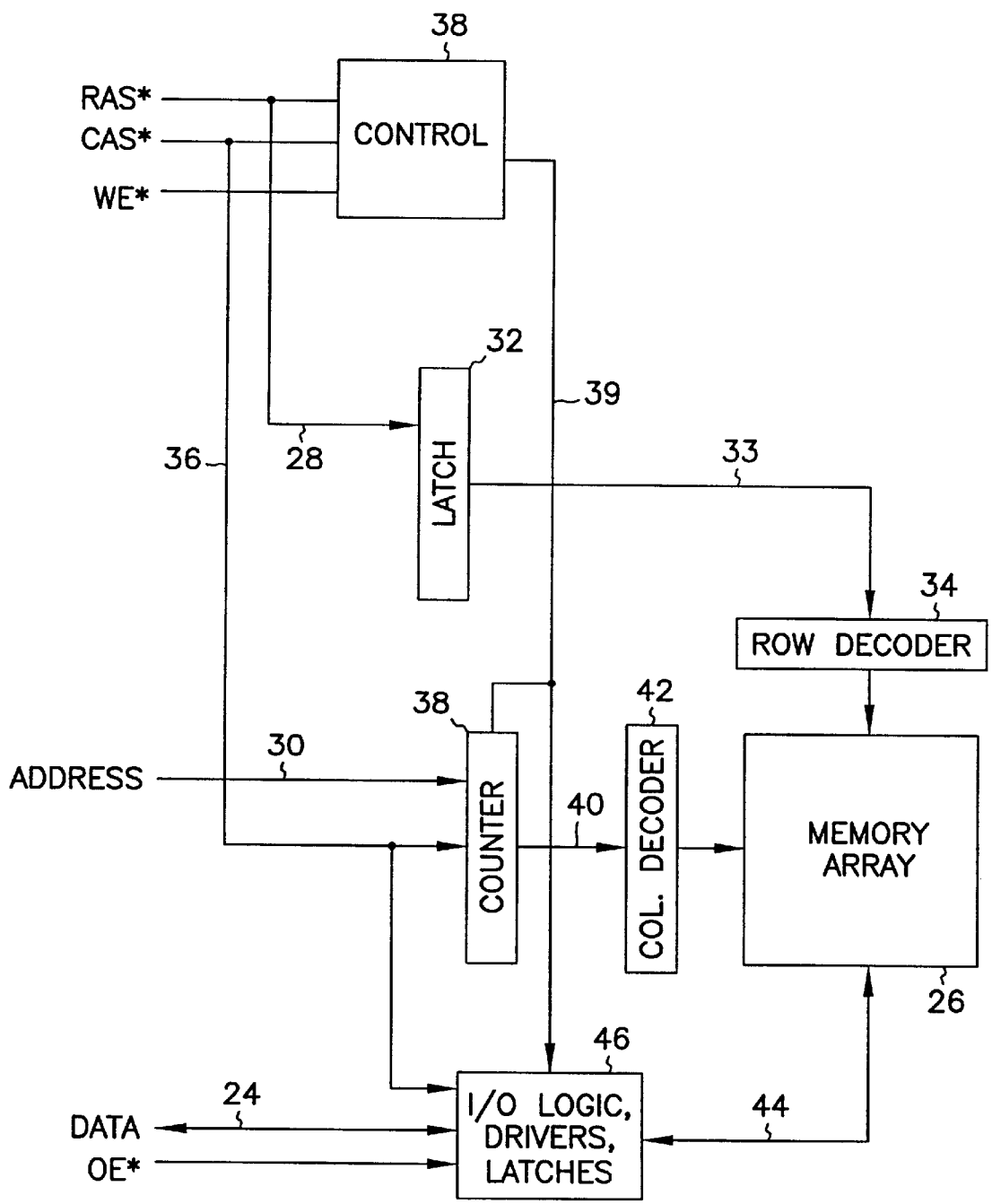
FIG. 3 is a block diagram of a DRAM incorporating the present invention.

The above described laser antifuse can be fabricated in any integrated circuit, including but not limited to programmable logic devices, PROMs, EPROMs, EEPROMs, and memories such as SRAMs and DRAMs. FIG. 3 illustrates a sixteen megabit memory device incorporating the present invention. The device is organized as a 2 Meg×8 Burst EDO DRAM having an eight bit data input/output path 24 providing data storage for 2,097,152 bytes of information in the memory array 26. U.S. patent application Ser. No. 08/370,761, entitled BURST EDO MEMORY DEVICE, by Zager et al., and assigned to the assignee of the present invention describes a burst EDO memory in detail and is incorporated herein by reference. An active-low Row Address Strobe (RAS*) signal 28 is used to latch a first portion of a multiplexed memory address, from address inputs 30, in latch 32. The latched row address 33 is decoded in row decoder 34. The decoded row address is used to select a row of the memory array 26. A Column Address Strobe (CAS*) signal 36 is used to latch a second portion of a memory address from address inputs 30 into address generation circuit 38. The latched column address 40 is decoded in column address decoder 42. The decoded column address is used to select a column of the memory array 26.

In a burst read cycle, data within the memory array located at the row and column address selected by the row and column address decoders is read out of the memory array and sent along data path 44 to output latches. Once the memory device begins to output data in a burst read cycle, the output drivers 46 will continue to drive the data lines without tri-stating the data outputs during CAS* high intervals dependent on the state of the Output Enable and Write Enable (OE* and WE*) control lines, thus allowing additional time for the system to latch the output data. The data outputs remain valid throughout the burst read cycles with the exception of brief periods of data transition.

Once a row and a column address are selected, additional transitions of the CAS* signal are used to advance the column address within the address generation circuit in a predetermined sequence. The address may be advanced linearly, or in an interleaved fashion for maximum compatibility with the overall system requirements. The output data signal levels may be but are not limited to being driven in accordance with standard CMOS, TTL, LVTTL, GTL, or HSTL output level specifications.

Figure 4:
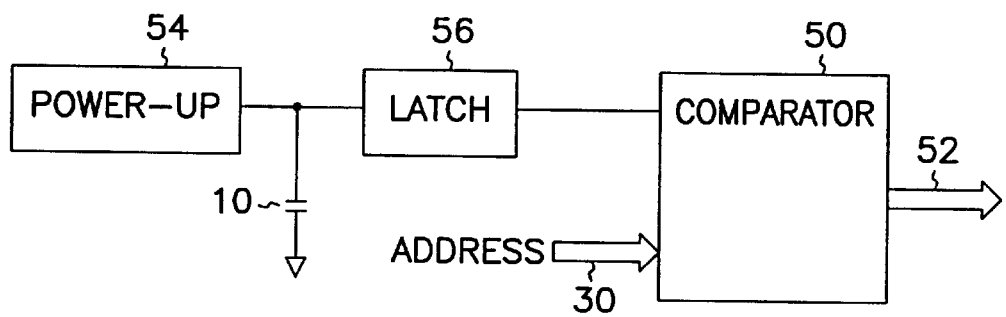
FIG. 4 is a schematic diagram of circuitry of the DRAM of FIG. 3.

FIG. 4 illustrates a portion of FIG. 3 which incorporates laser antifuse 10 in the address decoder circuitry 34 and 42. The laser antifuses are used to indicate memory cell addresses of memory cells which have been determined to be defective such that redundant memory cells can be used. A comparator 50 is provided which compares the external memory addresses 30 to the laser antifuses and produces an appropriate memory cell output address 52. The output address can then be used to access redundant memory cells when appropriate. The laser antifuse is coupled to both a power-up circuit 54 and a latch circuit 56. The power-up circuit is used to read the laser antifuse when the memory is first turned on, and the latch circuit is used to latch the state of the laser antifuse during normal operations. It will be appreciated that the laser antifuse 10 can be incorporated into the memory circuit for any desired purpose and is not limited to redundant memory cell circuitry.

Figure 5:
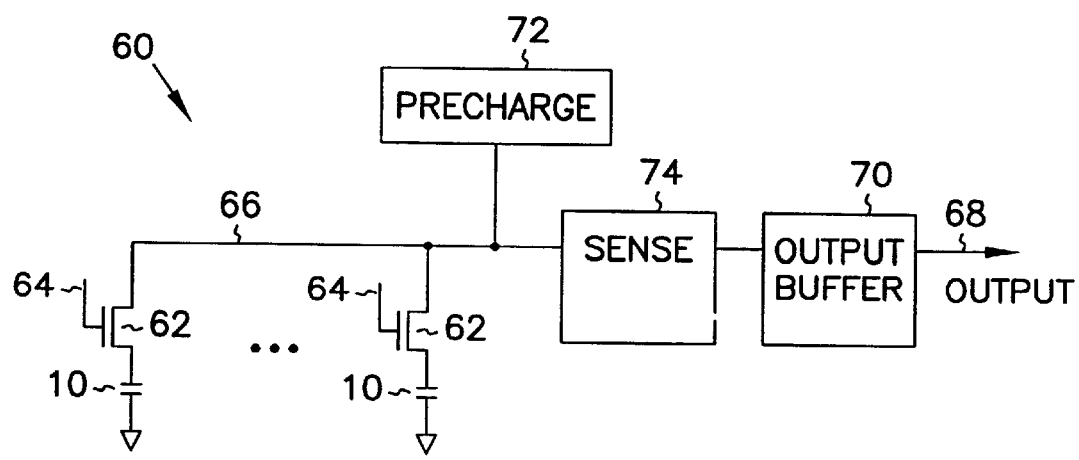
FIG. 5 is a block diagram of a portion of PROM incorporating the present invention.

FIG. 5 illustrates a portion of another integrated circuit incorporating the present invention. The integrated circuit is a programmable read only memory (PROM) 60 wherein the laser antifuses 10 are used as memory cells. The PROM includes laser antifuse memory cells 10 which are coupled between ground and an access transistor 62. The gate of the access transistor is connected to a word line 64 which can be selectively activated to couple the memory cell to digit line 66. The digit line can be coupled to the output lines 68 of the memory through a buffer 70. In operation, the laser antifuse memory cells are programmed using the laser as described above. To read the memory cells, the digit line is first pre-charged to a predetermined voltage level using pre-charge circuit 72. A word line 64 is then activated to coupled a memory cell 10 to the digit line 66. If the memory cell has been programmed using a laser, the digit line is discharged through the memory cell. If the laser antifuse has not been programmed, the digit line voltage remains substantially unchanged. Sensing circuitry 74 is used to sense the digit line voltage and amplify the signal for outputting on the external communication lines via buffer 70. It will be appreciated that the laser antifuse can be incorporated into the PROM for any desired purpose and is not limited to programmable memory cells.

Conclusion

A laser antifuse has been described which can be fabricated on an integrated circuit which does not require additional fabrication steps. The laser antifuse, in its normal physical state, operates as a capacitor having two conductive plates separated by a layer of dielectric material. The physical state of the laser antifuse is changed by using an external radiation source, such as a laser, to rupture the dielectric layer and create an electrical short between the conductive plates. The laser antifuse has been described as being fabricated as a fat capacitor which could have either an N-type or P-type well as one of the conductive plates.

Two of the numerous applications of the laser antifuse have been described: redundant circuitry enable, and programmable memory cells. Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. An integrated circuit laser antifuse having first and second states, comprising:
   a first conductive plate;
   a second conductive plate, wherein the second conductive plate comprises an active area of an integrated circuit;
   a layer of dielectric material located between the first conductive plate and the second conductive plate; and
   at least two circuit connection regions extending into the second conductive plate and electrically connected to the second conductive plate, wherein the at least two circuit connection regions are physically separated from each other;
   wherein the first conductive plate and the at least circuit connection regions are electrically isolated in the first state, and wherein the first conductive plate and the at least two circuit connection regions are electrically connected in the second state upon electrically connecting the first conductive plate and the second conductive plate through the layer of dielectric material in response to a focused external radiation source.

2. The integrated circuit laser antifuse of claim 1 wherein the first conductive plate comprises a layer of polysilicon fabricated on the layer of dielectric material.

3. The integrated circuit laser antifuse of claim 1 wherein the dielectric material comprises material selected from the group consisting of oxide and barium strontium titanium.

4. The integrated circuit laser antifuse of claim 1 wherein the second conductive plate comprises an N-well fabricated in a P-substrate.

5. The integrated circuit laser antifuse of claim 4 wherein the at least two circuit connection regions comprise N+ contact regions fabricated in the N-well.

6. The integrated circuit laser antifuse of claim 1 wherein the second conductive plate comprises a P-well fabricated in an N-substrate.

7. The integrated circuit laser antifuse of claim 6 wherein the at least two circuit connection regions comprise P+ contact regions fabricated in the P-well.

8. The integrated circuit laser antifuse of claim 1 wherein the focused external radiation source comprises a laser.

9. A method of programming an integrated circuit laser antifuse having first and second states, wherein the integrated circuit laser antifuse comprises a first conductive plate, a second conductive plate comprising an active area of an integrated circuit, a layer of dielectric material located between the first conductive plate and the second conductive plate and electrically isolating the first conductive plate from the second conductive plate in the first state, and at least two circuit connection regions extending into the second conductive plate and electrically connected to the second conductive plate, wherein the at least two circuit connection regions are physically separated from each other, the method comprising:
   focusing an external radiation source on the first conductive plate while in the first state; and
   forming a conductive path from the first conductive plate through the layer of dielectric material to the second conductive plate, thereby producing the second state and electrically connecting each of the at least two circuit connection regions to the first conductive plate.

10. The method of claim 9 wherein focusing an external radiation source comprises focusing a laser.

11. A method of programming an integrated circuit laser antifuse having first and second states, wherein the integrated circuit laser antifuse comprises a first conductive plate, a second conductive plate comprising an active area of an integrated circuit, a layer of barium strontium titanium located between the first conductive plate and the second conductive plate and electrically isolating the first conductive plate from the second conductive plate in the first state, and at least two circuit connection regions extending into the second conductive plate and electrically connected to the second conductive plate, wherein the at least two circuit connection regions are physically separated from each other, the method comprising:
   focusing a laser on the first conductive plate while in the first state; and
   forming a conductive path from the first conductive plate through the layer of barium strontium titanium to the second conductive plate, thereby producing the second state and electrically connecting each of the at least two circuit connection regions to the first conductive plate.

12. An integrated circuit, comprising:
   an integrated circuit laser antifuse having first and second states, wherein the integrated circuit laser antifuse comprises:
      a first conductive plate;
      a second conductive plate, wherein the second conductive plate comprises an active area of an integrated circuit;
      a layer of dielectric material located between the first conductive plate and the second conductive plate; and
      at least two circuit connection regions extending into the second conductive plate and electrically connected to the second conductive plate, wherein the at least two circuit connection regions are physically separated from each other;
   wherein the first conductive plate and the at least two circuit connection regions are electrically isolated in the first state, and wherein the first conductive plate and the at least two circuit connection regions are electrically connected in the second state upon electrically connecting the first conductive plate and the second conductive plate through the layer of dielectric material in response to a focused external radiation source.

13. The integrated circuit of claim 12 wherein the first conductive plate comprises a layer of polysilicon fabricated on the layer of dielectric material.

14. The integrated circuit of claim 12 wherein the dielectric material comprises material selected from the group consisting of oxide and barium strontium titanium.

15. The integrated circuit of claim 12 wherein the second conductive plate comprises an N-well fabricated in a P-substrate.

16. The integrated circuit of claim 15 wherein the at least two circuit connection regions comprise N+ contact regions fabricated in the N-well.

17. The integrated circuit of claim 12 wherein the second conductive plate comprises a P-well fabricated in an N-substrate.

18. The integrated circuit of claim 17 wherein the at least two circuit connection regions comprise P+ contact regions fabricated in the P-well.

19. The integrated circuit of claim 12 wherein the focused external radiation source comprises a laser.

20. An integrated circuit memory device, comprising:
   a memory array;
   a column address decoder circuit coupled to the memory array;
   a row address decoder circuit coupled to the memory array; and
   at least one integrated circuit laser antifuse having first and second states, wherein each at least one integrated circuit laser antifuse is coupled to a circuit selected from the group consisting of the column address decoder circuit and the row address decoder circuit, further wherein each at least one integrated circuit laser antifuse comprises:
      a first conductive plate;
      a second conductive plate, wherein the second conductive plate comprises an active area of an integrated circuit;
      a layer of dielectric material located between the first conductive plate and the second conductive plate; and
      at least two circuit connection regions extending into the second conductive plate and electrically connected to the second conductive plate, wherein the at least two circuit connection regions are physically separated from each other;
      wherein the first conductive plate and the at least two circuit connection regions are electrically isolated in the first state, and wherein the first conductive plate and the at least two circuit connection regions are electrically connected in the second state upon electrically connecting the first conductive plate and the second conductive plate through the layer of dielectric material in response to a focused external radiation source.

21. The integrated circuit memory device of claim 20 wherein the first conductive plate comprises a layer of polysilicon fabricated on the layer of dielectric material.

22. The integrated circuit memory device of claim 20 wherein the dielectric material comprises material selected from the group consisting of oxide and barium strontium titanium.

23. The integrated circuit memory device of claim 20 wherein the second conductive plate comprises an N-well fabricated in a P-substrate.

24. The integrated circuit memory device of claim 23 wherein the at least two circuit connection regions comprise N+ contact regions fabricated in the N-well.

25. The integrated circuit memory device of claim 20 wherein the second conductive plate comprises a P-well fabricated in an N-substrate.

26. The integrated circuit memory device of claim 25 wherein the at least two circuit connection regions comprise P+ contact regions fabricated in the P-well.

27. The integrated circuit memory device of claim 20 wherein the focused external radiation source comprises a laser.

28. An integrated circuit programmable memory device, comprising:
   a word line;
   a digit line;
   a plurality of access transistors, wherein each one of the plurality of access transistors comprises a first source/drain coupled to the digit line, a gate coupled to the word line and a second source/drain; and
   a plurality of laser antifuse memory cells, wherein each one of the plurality of laser antifuse memory cells has first and second states, further wherein each one of the plurality of laser antifuse memory cells is coupled to the second source/drain, still further wherein each one of the plurality of laser antifuse memory cells comprises:
      a first conductive plate;
      a second conductive plate, wherein the second conductive plate comprises an active area of an integrated circuit;
      a layer of dielectric material located between the first conductive plate and the second conductive plate; and
      at least two circuit connection regions extending into the second conductive plate and electrically connected to the second conductive plate, wherein the at least two circuit connection regions are physically separated from each other;
      wherein the first conductive plate and the at least two circuit connection regions are electrically isolated in the first state, and wherein the first conductive plate and the at least two circuit connection regions are electrically connected in the second state upon electrically connecting the first conductive plate and the second conductive plate through the layer of dielectric material in response to a focused external radiation source.

29. The integrated circuit programmable memory device of claim 28 wherein the first conductive plate comprises a layer of polysilicon fabricated on the layer of dielectric material.

30. The integrated circuit programmable memory device of claim 28 wherein the dielectric material comprises material selected from the group consisting of oxide and barium strontium titanium.

31. The integrated circuit programmable memory device of claim 28 wherein the second conductive plate comprises an N-well fabricated in a P-substrate.

32. The integrated circuit programmable memory device of claim 31 wherein the at least two circuit connection region comprise N+ contact regions fabricated in the N-well.

33. The integrated circuit programmable memory device of claim 28 wherein the second conductive plate comprises a P-well fabricated in an N-substrate.

34. The integrated circuit programmable memory device of claim 33 wherein the at least two circuit connection regions comprise P+ contact regions fabricated in the P-well.

35. The integrated circuit programmable memory device of claim 28 wherein the focused external radiation source comprises a laser.

* * * * *

UNITED STATES PATENT AND TRADEMARK OFFICE
CERTIFICATE OF CORRECTION

PATENT NO.    : 6,252,293 B1
DATED         : June 26, 2001
INVENTOR(S)   : Seyyedy et al.

It is certified that error appears in the above-identified patent and that said Letters Patent is hereby corrected as shown below:

<u>Title page,</u>
Item [57], ABSTRACT
Line 3, delete "has to conductive " and insert -- has two conductive --, therefor.

<u>Column 5, claim 1,</u>
Line 33, delete "least circuit" and insert -- least two circuit --, therefor.

<u>Column 8, claim 32,</u>
Line 54, delete "region" and insert -- regions --, therefor.

Signed and Sealed this

Fifth Day of February, 2002

Attest:

JAMES E. ROGAN
*Attesting Officer*   *Director of the United States Patent and Trademark Office*